United States Patent
Murakami

[19]

[11] Patent Number: 5,874,780
[45] Date of Patent: Feb. 23, 1999

[54] METHOD OF MOUNTING A SEMICONDUCTOR DEVICE TO A SUBSTRATE AND A MOUNTED STRUCTURE

[75] Inventor: Tomoo Murakami, Tokyo, Japan

[73] Assignee: NEC Corporation, Tokyo, Japan

[21] Appl. No.: 686,550

[22] Filed: Jul. 26, 1996

[30] Foreign Application Priority Data

Jul. 27, 1995 [JP] Japan ................................... 7-191737

[51] Int. Cl.⁶ .......................... H01L 23/48; H01L 23/52; H01L 29/40
[52] U.S. Cl. .......................... 257/775; 174/260; 361/768; 361/773; 361/774; 29/739; 29/841; 257/737; 257/738; 257/772; 257/773; 257/778
[58] Field of Search .............................. 29/840, 739, 841; 228/180.22; 174/260; 257/772, 773, 775, 737, 738, 778; 361/768, 773, 774

[56] References Cited

U.S. PATENT DOCUMENTS

| | | |
|---|---|---|
| 5,037,780 | 8/1991 | Fujimoto et al. .......................... 29/841 |
| 5,070,604 | 12/1991 | Banba et al. .......................... 29/840 X |
| 5,348,214 | 9/1994 | Nishiguchi et al. ................... 29/841 X |
| 5,410,807 | 5/1995 | Bross et al. .......................... 29/840 X |
| 5,478,007 | 12/1995 | Marrs .................................... 29/840 X |
| 5,518,964 | 5/1996 | DiStefano et al. ..................... 29/840 X |
| 5,615,824 | 4/1997 | Fjelstad et al. ........................ 29/840 X |

FOREIGN PATENT DOCUMENTS

4-82241  3/1992  Japan .

*Primary Examiner*—Peter Vo
*Assistant Examiner*—Rick Kiltae Chang
*Attorney, Agent, or Firm*—Sughrue, Mion, Zinn, Macpeak & Seas, PLLC

[57] ABSTRACT

A semiconductor device comprises a plurality of bump electrodes at least to one surface. A circuit substrate is formed with a laminate structure having an inner layer circuit and a mounting pad is formed on the substrate. The mounting pad has a concave portion and the bottom of the concave portion is in contact with the inner layer circuit. Further, an sealing resin is provided on the substrate. The bump electrode and the concave portion of the mounting pad are opposed, and the bump electrode is pressed to the bottom of the concave portion of the mounting pad, thereby deforming the pointed shape portion at the top end of the bump electrode. By the deformation the pointed shape portion, the contact portion between the bump electrode and the mounting pad is gradually enlarged from a point to a plane. After deforming the bump electrode by a predetermined amount, the sealing resin is hardened and the semiconductor device is mounted on a substrate.

5 Claims, 9 Drawing Sheets

METHOD OF MOUNTING A SEMICONDUCTOR DEVICE TO A SUBSTRATE AND A MOUNTED STRUCTURE

BACKGROUND OF THE INVENTION

1. Field of the Invention

The present invention relates to a method of mounting a semiconductor device to a substrate and a mounted structure thereof and, more in particular, to a method of mounting a semiconductor device to a substrate by a flip-chip system and a mounting structure thereof.

2. Description of the Related Art

Accompanying with reduction in the size and lowering of the cost in electronic equipments in recent years, a structure for mounting semiconductor devices on a substrate at a high density has been simplified. A flip-chip system has been proposed as a high density mounting structure of semiconductor devices having such a simplified structure.

Figure 1A:
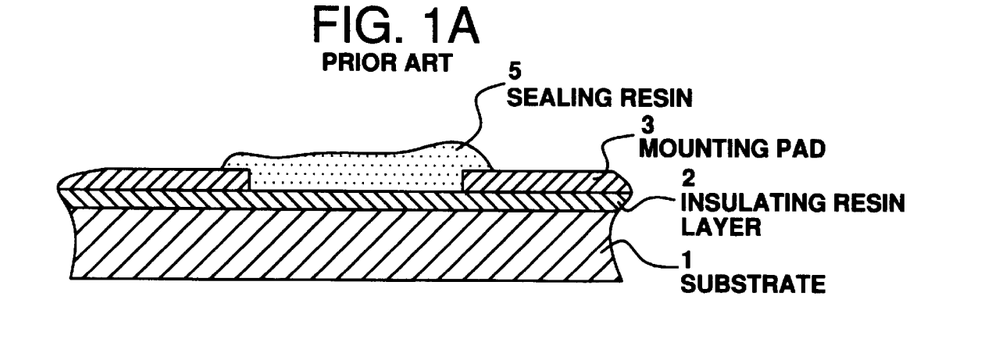
FIGS. 1A and 1B are views illustrating the conventional structure in which a semiconductor device is mounted to a circuit substrate by an flip-chip system.
Figure 1B:
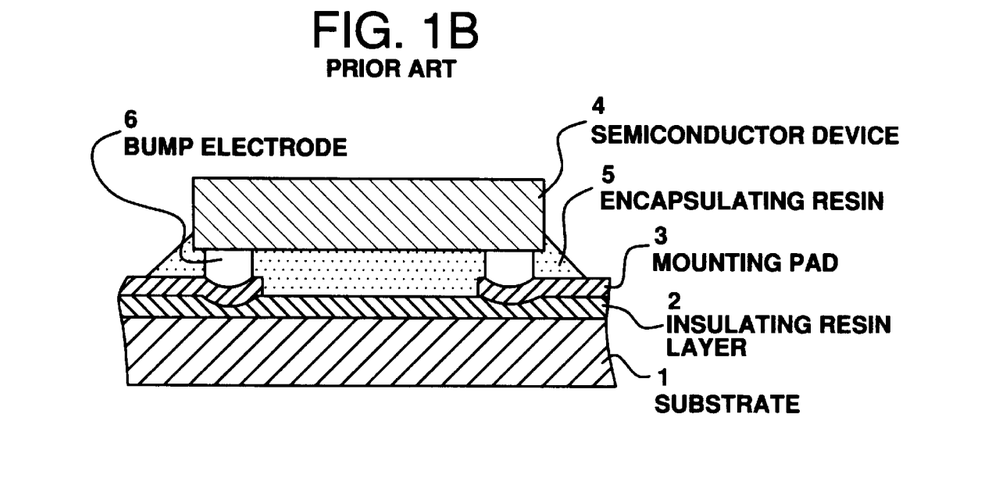

In the flip-chip system, a semiconductor device with a plurality of bump electrodes being mounted to at least one surface thereof is connected to a circuit substrate with the surface being faced downward, which is disclosed in Japanese Patent Laid-Open Hei 4-82241. Now, the conventional flip-chip mounting structure will be described with reference to FIG. 1.

Referring to FIG. 1, an insulating resin layer 2 made of a material such as rubber having elastic recovery force is formed on a substrate 1. Further, a mounting pad 3 is formed on the insulating resin layer 2 by means of sputtering or vapor deposition. An sealing resin 5 is coated to a region on the insulating resin layer 2 in which a semiconductor device 4 is mounted to the substrate 1. On the other hand, a plurality of bump electrodes 6 are formed to the surface of the semiconductor device 4 facing the substrate 1.

In the manufacturing method of the conventional mounting structure, at first, a plurality of the bump electrodes 6 disposed on the lower surface of the semiconductor device 4 and the mounting pad on the substrate 1 are aligned and then the semiconductor device 4 is bonded under pressure on the substrate 1. In this case, since the sealing resin 5 between the bump electrode 6 of the semiconductor device 4 and the mounting pad 3 on the substrate 1 is extruded, the bump electrode 6 and the mounted pad 3 are connected electrically with each other. In this conventional flip-chip mounting structure, since the insulating resin layer 2 having the elastic recovery force is formed between the substrate 1 and the mounting pad 3, electric connection between the bump electrode 6 and the mounting pad 3 can be held stably by the elastic recovery force of the insulating resin layer 2 and the contracting force of the sealing resin 5.

However, in the conventional flip-chip mounting structure, the elastic recovery force of the insulating resin layer 2 or the contracting force of the sealing resin 5 tends to suffer from degradation in an accelerated test such as a temperature cycle test and, as a result, the amount of heat expansion of the sealing resin 5 is greater than the contracting force thereof and the elastic recovery force of the insulating resin layer 2, to form a gap between the bump electrode 6 and the mounting pad 3. Accordingly, the gap formed between the bump electrode 6 and the mounting pad 3 causes connection failure between the semiconductor device 4 and the substrate 1.

Further, in the conventional flip-chip mounting structure described above, the semiconductor device 4 and the substrate 1 are connected in a state where the mounting pad 3 and the insulating resin layer 2 are deformed elastically. Accordingly, when the balance between the contracting force of the sealing resin 5 and the elastic recovery force of the insulating resin layer 2 should change by the temperature change, the deformed state of the mounting pad 3 changes correspondingly. Thus, considerable stresses exert on the mounting pad 3 due to temperature change and, as a result, the mounting pad 3 is damaged to sometimes cause disconnection or the like.

Further, in the conventional flip-chip structure, since it is necessary to form the insulating resin layer 2 having the elastic recovery force on the substrate 1, it cannot avoid the complexity for the production step and increase of the production cost.

SUMMARY OF THE INVENTION

It is an object of the present invention to provide a method of mounting a semiconductor device to a substrate and a mounted structure thereof, capable of improving the reliability in a connected state.

It is another object of the present invention is to provide a method of mounting a semiconductor device to a substrate and a mounted structure thereof capable of maintaining a stable connection state to the increase of temperature or change of circumstantial temperature.

To achieve the above objects, the structure for mounting a semiconductor device to a substrate comprises a mounting pad disposed on the substrate, a sealing resin provided on the substrate on which the semiconductor device is to be mounted, and a plurality of projecting electrodes disposed on a surface of the semiconductor device facing the substrate, and each the projecting electrode including a substantially spherical portion and a pointed portion in contact under pressure with the mounting pad and deformed such that a contact portion with the mounting pad is enlarged from a point to a plane.

Further, to achieve the above objects, the method of mounting a semiconductor substrate having a plurality of projecting electrodes to a substrate, on which a mounting pad is formed and an sealing resin is provided, wherein the method comprises the steps of pressing the projecting electrode to the mounting pad and thereby deforming a pointed shape portion at the top end of each the projecting electrode and, hardening the sealing resin.

BRIEF DESCRIPTION OF THE DRAWINGS

The above and other objects, features and advantages of the present invention will become more apparent from the following detailed description taken with the accompanying drawings in which.

DETAILED DESCRIPTION

Figure 2A:
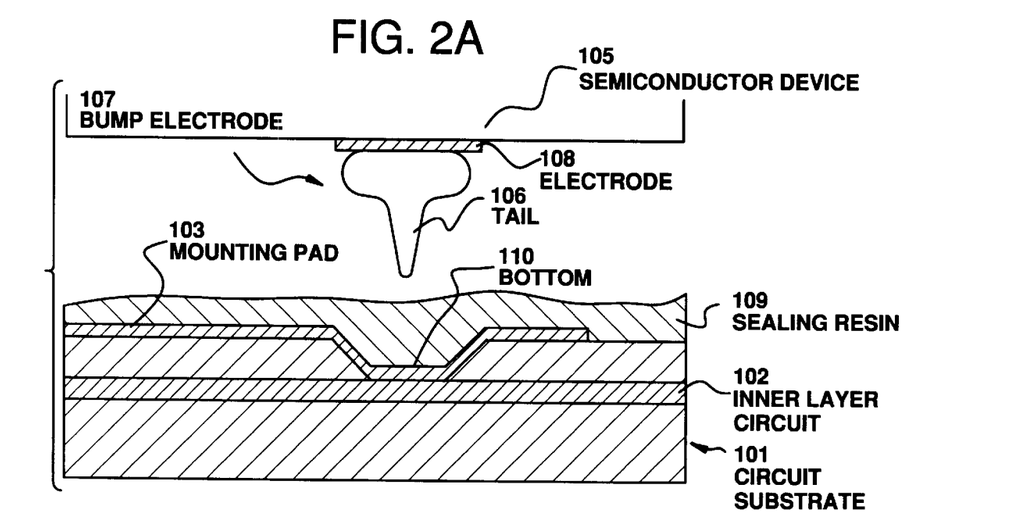
FIGS. 2A–2C are views illustrating a main portion of a mounted structure of a first embodiment and manufacturing steps thereof according to the present invention.

Referring to FIG. 2A, a concave mounting pad 103 is disposed on a circuit substrate 101 having an inner layer circuit 102 such that a bottom 110 of the pad 103 is in contact with the inner layer circuit 102. A bump electrode 107 having a pointed tail 106 are disposed by way of an electrode 108 on the side of a semiconductor device 105 facing the circuit substrate 101.

In FIG. 2A, a sealing resin 109 is supplied on the circuit substrate 101, and the semiconductor device 105 is aligned with the circuit substrate 101 such that the bump electrode 107 are opposed to the recess of the mounting pad 103.

Figure 2B:
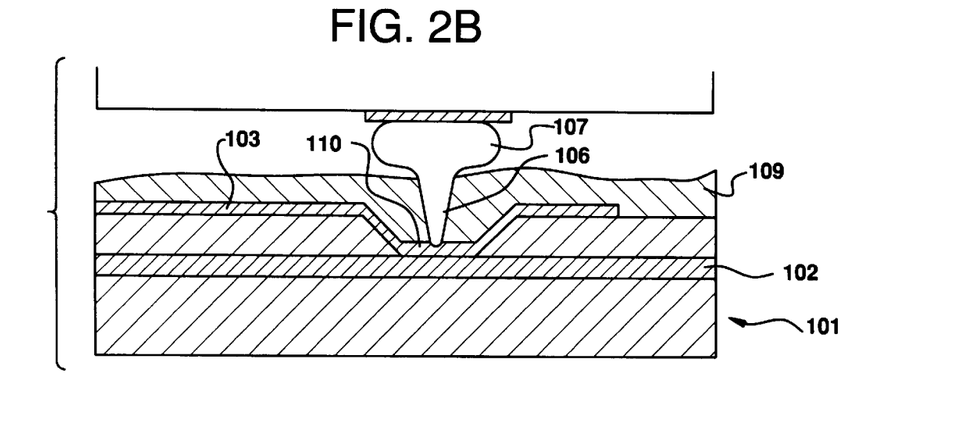
Figure 2C:
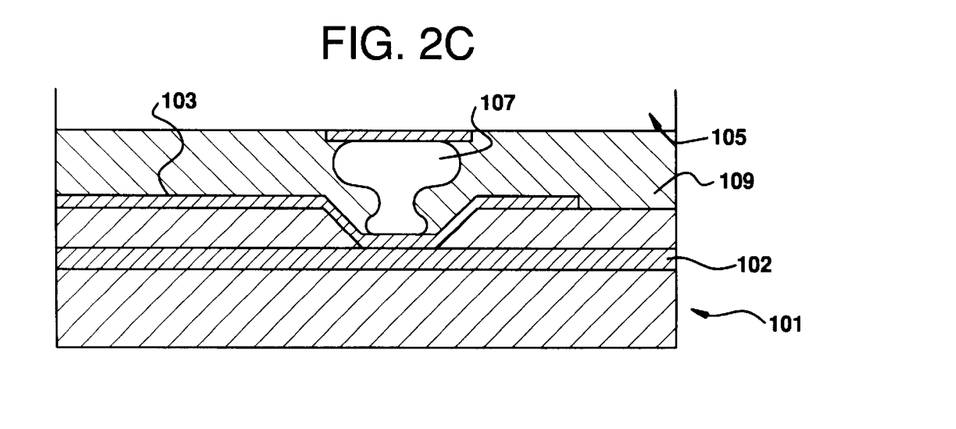

Referring to FIG. 2B, the tail 106 of the bump electrode 107 is buried into the sealing resin 109 by putting the semiconductor device 105 close to the circuit substrate 101. The top end of the buried tail 106 comes into contact with the bottom 110 of the mounting pad 103. Further, the semiconductor device 104 is pressed to the circuit substrate 101, such that the tail 106 of the bump electrode 107 is plastically deformed and in press contact with the bottom 110 of the mounting pad 103 as shown in FIG. 2C. Then, the sealing resin 109 is hardened by heating in a state in which the resin 109 is bonded also to the surface of the semiconductor device 104 on which the bump electrode 107 is disposed.

In this embodiment, even when the bump electrode 107 of the semiconductor device 104 is in contact with the mounting pad 103 of the circuit substrate 101 and then the bump electrode 107 is further urged strongly to the mounting pad 103, the inner layer 102 in contact with the bottom 110 of the mounting pad 103 disperses the pressing force to the mounting pad 103 by the bump electrode 107. Accordingly, since the mounting pad 103 does not deform by the pressing force and only the tail 106 of the bump electrode 107 is deformed plastically, the bump electrode 107 can be connected reliably with the mounting pad 103 without the damage to the mounting pad 103.

Further, in this embodiment, a resin having a hardening contraction greater than a heat expansion coefficient as the characteristic of the resin used for the press contact method is employed as the sealing resin 109. When the semiconductor device 105 is mounted by way of the sealing resin 109 to the circuit substrate 101 under pressure at a high heating temperature, the sealing resin 109 can attain a high contraction to reliably connect the bump electrode 107 and the mounting pad 103. Further, since the hardening contraction is greater than the heat expansion coefficient even under a high temperature circumstance, any force tending to detach the bump electrode 107 away from the mounting pad 103 does not exert and, accordingly, the connection state does not become instable.

Further, since the shape of the tail 106 of the bump electrode 107 is pointed, when the tail 106 is deformed by urging the bump electrode 107 to the mounting pad 103, the contact portion between the top end of the bump electrode 107 and the mounting pad 103 enlarges from a point to a plane. Accordingly, the sealing resin 109 on the mounting pad 103 is surely excluded from the contact portion between the tail 106 and the pad 103. Thus, reliable connection can be obtained with no obstacles between the bump electrode 107 and the mounting pad 103.

Next, the first embodiment according to the present invention is to be explained more in details with reference to FIGS. 3A–3D, 4A–4D, 5A–5B and FIG. 6.

Figure 3A:
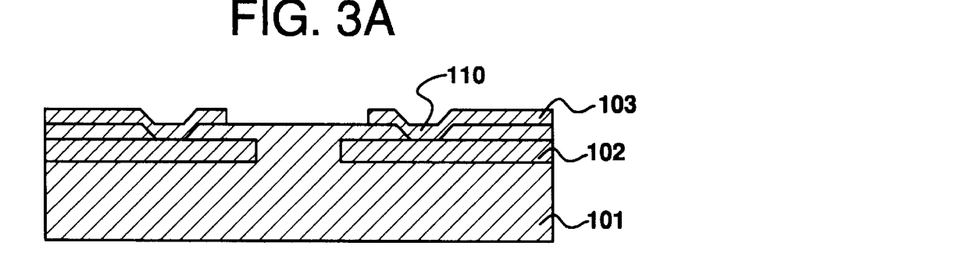
FIGS. 3A–3D are views illustrating a mounted structure of a first embodiment and manufacturing steps thereof according to the present invention.

Referring to FIG. 3A, a mounting pad 103 disposed on a circuit substrate 101 has a concave shape, and the bottom 110 of the concave portion of the mounting pad 103 is connected to the inner layer circuit 102 of the circuit substrate 101.

A method of manufacturing the circuit substrate having the inner layer circuit and provided with the mounting pad is to be explained referring to FIGS. 4A–4D.

The circuit substrate 101 can be manufactured by applying a method of forming a photo-viahole in a so-called build-up method in which resin layers are stacked on a printed circuit substrate and each of the layers is connected by means of photo-viaholes.

Figure 4A:
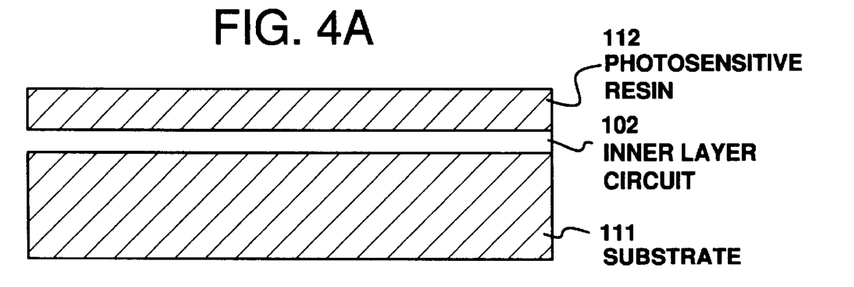
FIGS. 4A–4D are views illustrating a constitution of a circuit substrate and a forming step thereof in the first embodiment according to the present invention.
Figure 4B:
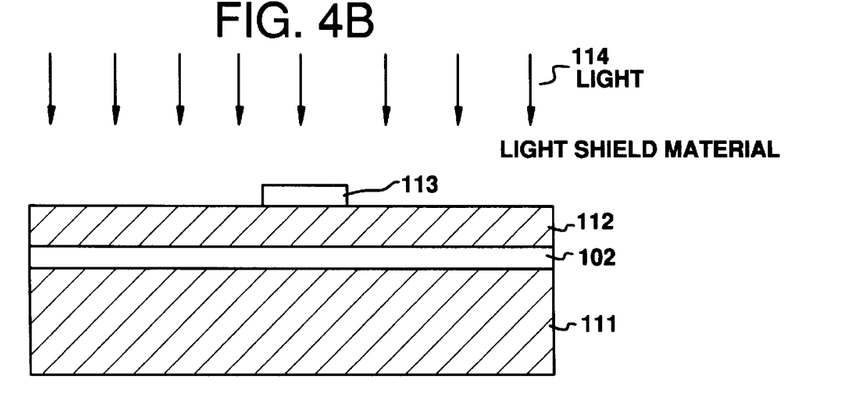
Figure 4C:
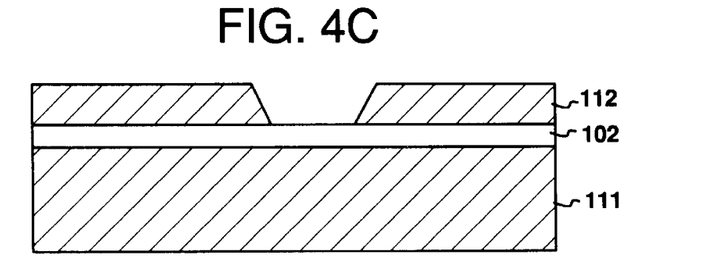

A laminate plate in which an inner layer circuit 102 is formed on a substrate 111 made of an epoxy-containing material is used for a circuit substrate 101. Referring to FIG. 4A, a photosensitive resin 112 is coated on the inner layer circuit 102. Further, as shown in FIG. 4B, a light shield material 113 is disposed on a part of the surface of the photosensitive resin 112 and a light 114 is irradiated uniformly from above to the photosensitive resin 112 and the light shield material 113. Then, as shown in FIG. 4C, the photosensitive resin 112 in a region irradiated with the light 114 is hardened on the inner layer circuit 102. On the other hand, since the light 114 is not irradiated only to the portion provided with the light shield material 113, the resin 112 shielded by the light shield material 113 is not hardened and removed, to expose a portion of the inner layer circuit 102. Further, a mounting pad 103 is formed on the photosensitive resin 112 and on the exposed inner layer circuit 102, for example, by means of plating method. Finally, polishing is applied to the surface of the mounting pad 103.

The method of manufacturing the circuit substrate 101 having the concave pad 103 is not restricted only to the photo-viahole method but an aperturing technique using a laser beam may also be applied.

Figure 4D:
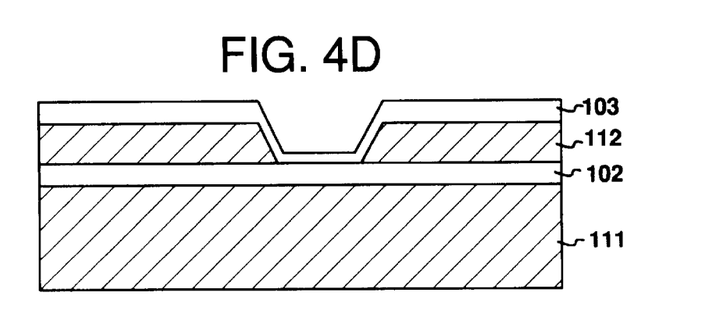

There is no particular restriction for the thickness of the mounting pad 103 since a desired thickness can be obtained by a well-known plating method and it is, for example, about 20 $\mu$m in this embodiment. Further, there is no particular restriction on the concave shape of the mounting pad 103 and a circular shape having an opening diameter of 90 $\mu$m and a bottom diameter of 50 $\mu$m is adopted in this embodiment.

Figure 3B:
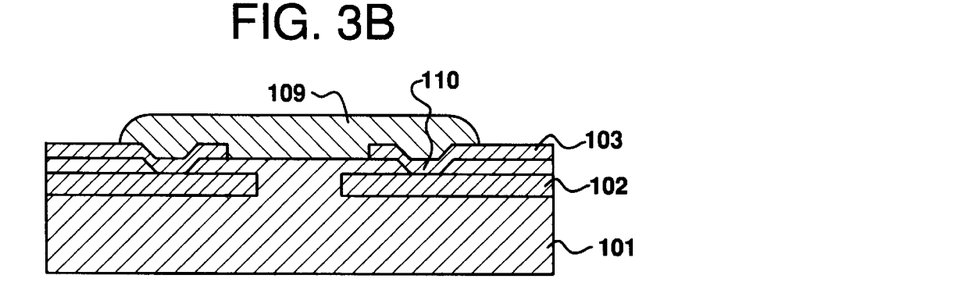

Referring to FIG. 3B, the sealing resin 109 is supplied to a region on a circuit substrate 101 for mounting a semiconductor device 105. As a method of supplying the sealing resin 109, a screen printing process can be applied but the method is not restricted only to the process but other known methods, for example, a method of supplying the sealing resin 109 on the circuit substrate 101 by using a dispenser can also be applied.

Further, as the sealing resin 109, a thermosetting-rapid curable resin having a hardening contraction value greater than the heat expansion coefficient value is used. In this embodiment, a resin completely capable of hardening by applying heating at 270° C. for about 30 sec is used as the sealing resin 109 for instance.

As the sealing resin in this embodiment, not only a resin hardened under heating but also a resin hardened under the irradiation of ultra-violet rays may also be used.

Figure 3C:
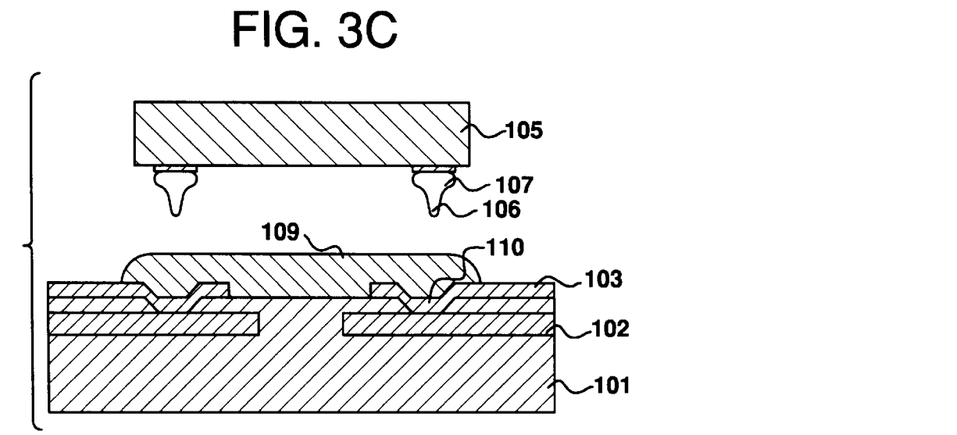

Then, as shown in FIG. 3C, positioning is conducted such that the plurality of bump electrodes 107 formed on the lower surface of the semiconductor device 105 correspond to the position on the bottom 110 of the mounting pad 103 on the circuit substrate 101.

Figure 5A:
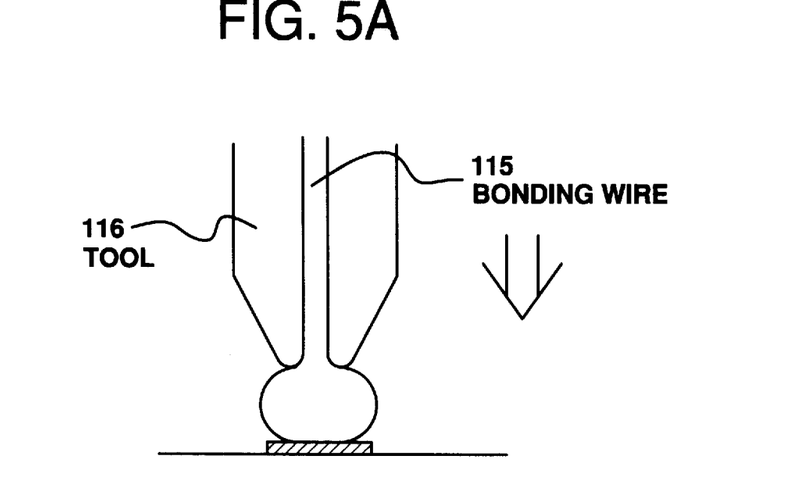
FIGS. 5A and 5B are views for explaining the steps of forming bump electrode having a tail portion according to the present invention.
Figure 5B:
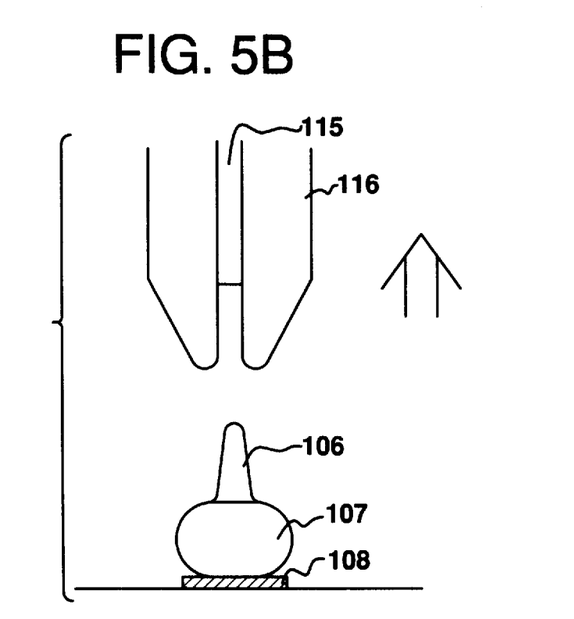

In this case, the bump electrode having the tail can be formed by applying a wire bonding method as shown in FIGS. 5A and 5B. As a material for a wire for forming the bump electrode, gold or gold-containing alloy is applied. Particularly, a material formed by adding a specified element to gold at 99.99% purity and applying heat treatment is used.

Referring to FIG. 5A, a bonding wire 115 having a spherically formed top end is in press contact onto an electrode 108 by a tool 116 at a predetermined pressing force. Then, as shown in FIG. 5B, the bonding wire 115 is broken at a predetermined height by pulling up the tool 116 just above the electrode 108 by a predetermined force, by which a bump electrode 107 having a pointed tail with no variation for the height at the substantially spherical portion can be formed on the electrode 108.

Figure 6:
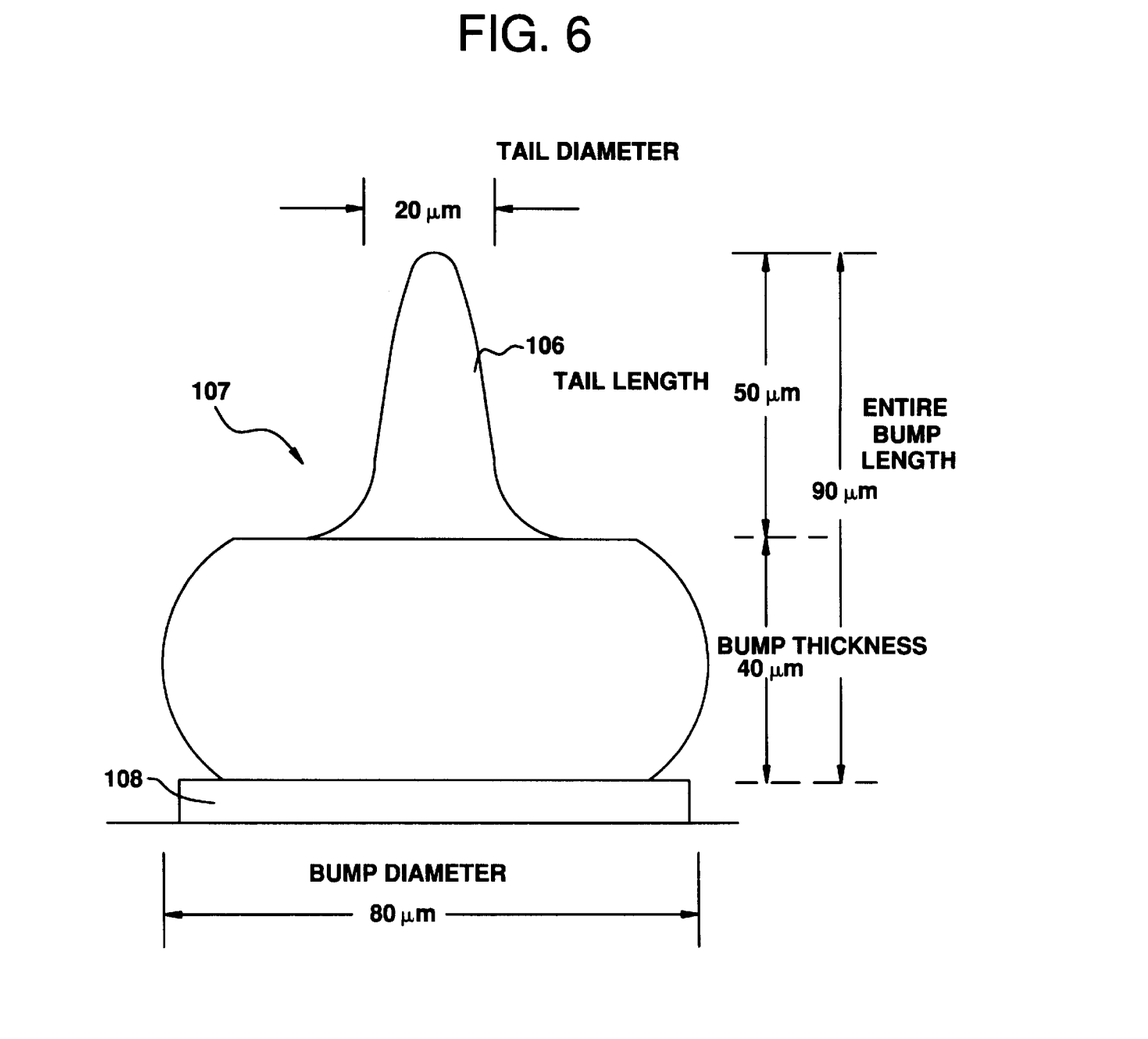
FIG. 6 is view illustrating the size of a bump electrode having a tail portion according to the present invention.

Further, the shape of the bump electrode 107 in this embodiment, it is defined such that the bump diameter is 80 $\mu$m, the tail diameter is 20 $\mu$m, the bump thickness is 40 $\mu$m and the tail length 50 $\mu$m as shown in FIG. 6. However, such sizes are limited not particularly only thereto but the bump diameter can be designed properly in accordance with the size of the electrode 108 disposed on the semiconductor device 105, and the tail diameter is substantially made equal with the diameter of the bonding wire 115 used depending on the desired bump diameter.

Further, while the tail length is preferably designed to a height of about 40%–70% to the entire bump length, which is the sum of the bump thickness and the tail length and, more preferably, about 50%–60% relative to the sum. When the tail length is too short or too long relative to the entire bump length, the height of the bump electrode tends to vary upon connecting the semiconductor device and the circuit substrate and, as a result, no satisfactory connection state can be obtained.

Figure 3D:
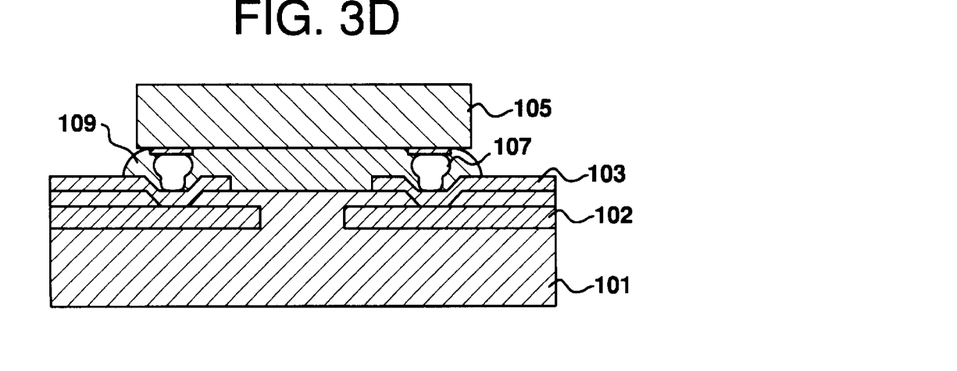

Referring to FIG. 3D, the semiconductor device 105 is pressed under heating to the circuit substrate 101. In this case, the pressure is determined to such a level as sufficient to deform the bump electrode 107, which is about 30 g per one bump electrode 107 in this embodiment. Further, the amount of heating is 270° C. for the semiconductor device 105 and 80° C. for the circuit substrate 101, for a retention time of 30 sec. As the amount of deformation of the bump electrode 107 substantially, the entire portion of the tail 106 is preferably deformed, and the height of the tail 106 after plastic deformation is at least less than 50% of the tail length before deformation.

The area of contact between the tail 107 and the bottom 110 of the mounting pad 103 is enlarged from a point to a plane as the tail 106 deform plastically. Accordingly, the sealing resin 109 can be extruded completely from the contact portion between the bump electrode 107 and the mounting pad 103 making the contact state satisfactory. Further, since the area of contact is enlarged, a stable connection state can be obtained.

Further, the pressing force exerting from the bump electrode 107 to the mounting pad 103 is dispersed in the inner layer circuit 102 disposed below the mounting pad 103. Accordingly, deformation of the mounting pad 103 can be reduced.

Next, a second embodiment of the present invention will be explained with reference to FIGS. 7A–7C and FIGS. 8A–8D.

Figure 7A:
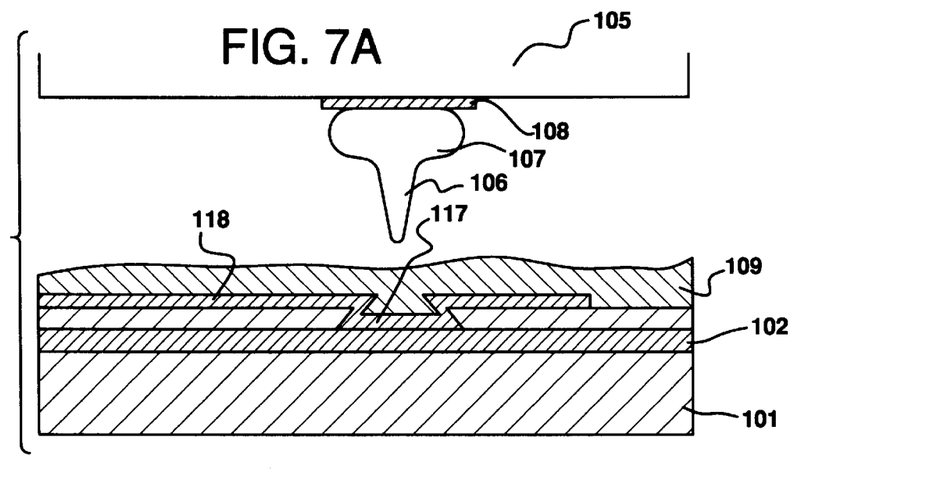
FIGS. 7A–7C are views illustrating a main portion of a mounted structure of a second embodiment and manufacturing steps thereof according to the present invention.
Figure 7B:
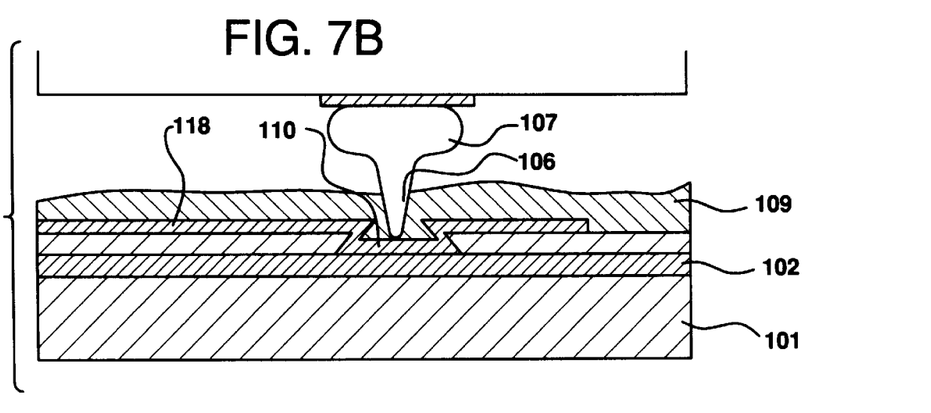
Figure 7C:
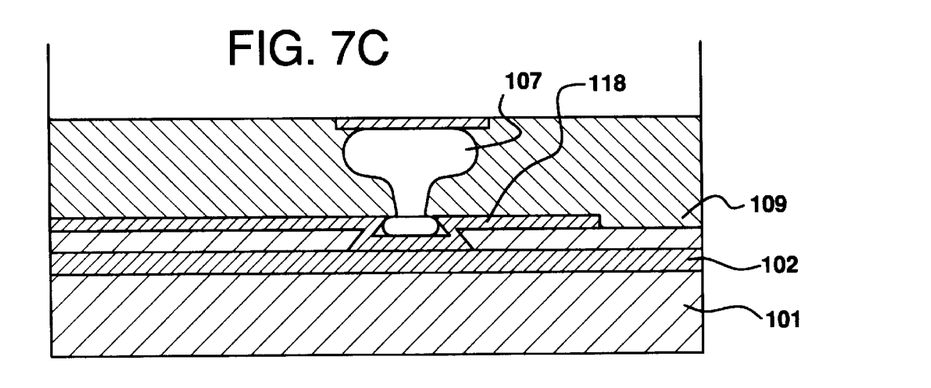
Figure 8A:
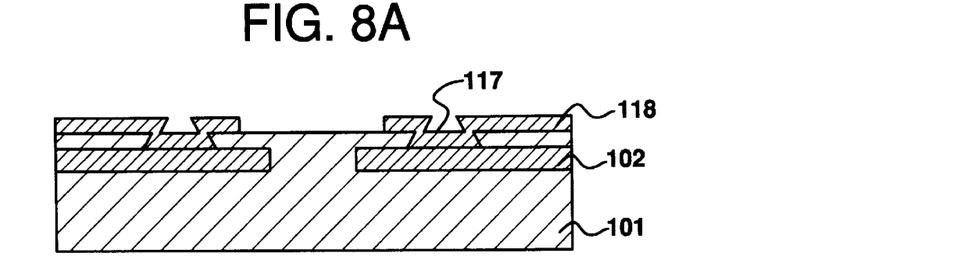
FIGS. 8A–8D are views illustrating a mounted structure of a second embodiment and manufacturing steps thereof according to the present invention.
Figure 8B:
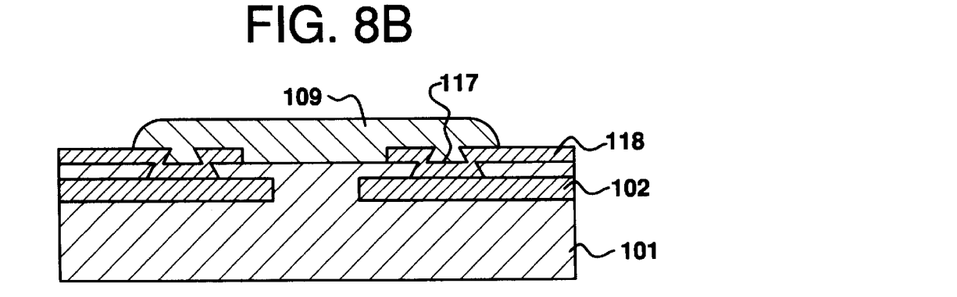
Figure 8C:
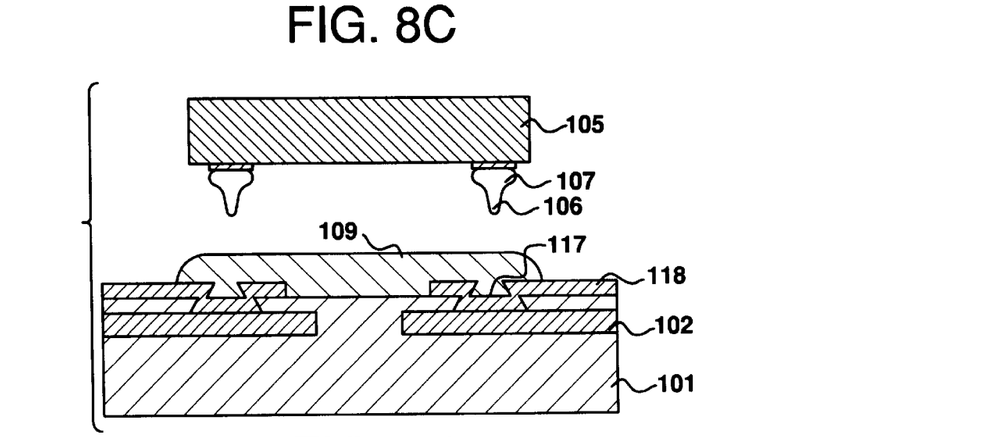
Figure 8D:
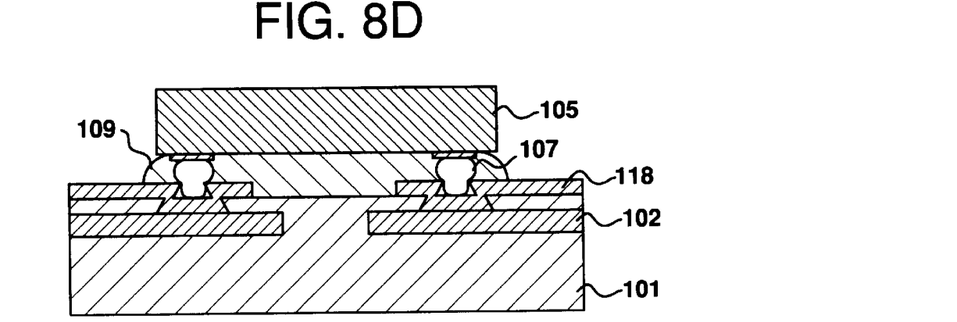

Referring to FIG. 7A, a semiconductor device 104, and a plurality of bump electrodes 107 each having a tail 106 disposed to the semiconductor device 104 have the same constitution as that in the first embodiment described previously. Accordingly, a method shown in FIGS. 5A and 5B can be applied as a method of forming the bump electrode 107, and the shape shown in FIG. 6 is applicable for the shape of the bump electrode 107. On the other hand, a concave mounting pad 118 having a bottom 117 in contact with an inner layer circuit 102 is disposed to a circuit substrate 101 of a laminate structure having the inner layer circuit 102. The concave portion of the mounting pad 118 has a trapezoidal cross sectional shape as shown in FIG. 7A in which the diameter at the bottom 117 is larger than that for the opening. A method of forming the photo-viahole in the build-up process to the printed substrate shown in FIG. 4 is basically applicable as a method of forming the circuit substrate 101 having the mounting pad 118 of such a shape. The polishing amount has to be adjusted upon forming the photo-viahole in this embodiment for making a trapezoidal cross sectional shape for the concave portion of the mounting pad 118.

In this embodiment, a circular shape with an opening diameter of 40 $\mu$m and a bottom diameter of 50 $\mu$m is used as a shape for the concave portion of the mounting pad 118.

Steps of mounting the semiconductor device 105 to the circuit substrate 101 in this embodiment are identical with those for the first embodiment shown in FIGS. 2A and 2C and FIGS. 3A and 3D. However, when the bump electrode 107 is deformed plastically by heating and pressing the semiconductor device 105 to the circuit substrate 101, it is preferred that the maximum diameter of the tail 106 after deformation is made greater than the opening diameter of the mounting pad 118. With such a constitution, the bump electrode 107 is caught at the opening portion of the mounting pad 118 and secured to the inside of the concave portion of the mounting pad 118. Accordingly, since the retaining force for connection between the bump electrode 107 and the mounting pad 118 is provided not only by the contracting force of the sealing resin 109 but also by the physical retaining force due to the structural engaging function, the connection reliability can be improved further.

In this embodiment, since the structural connection retaining force can be obtained, an sealing resin having a cure constraction value smaller than the heat expansion coefficient value can also be used.

The first and the second embodiments according to the present invention show examples in which the mounting pad is formed in the concave shape and, further, a laminate structure having an inner layer circuit is used as the circuit substrate, but the present invention is not restricted only thereto.

Figure 9A:
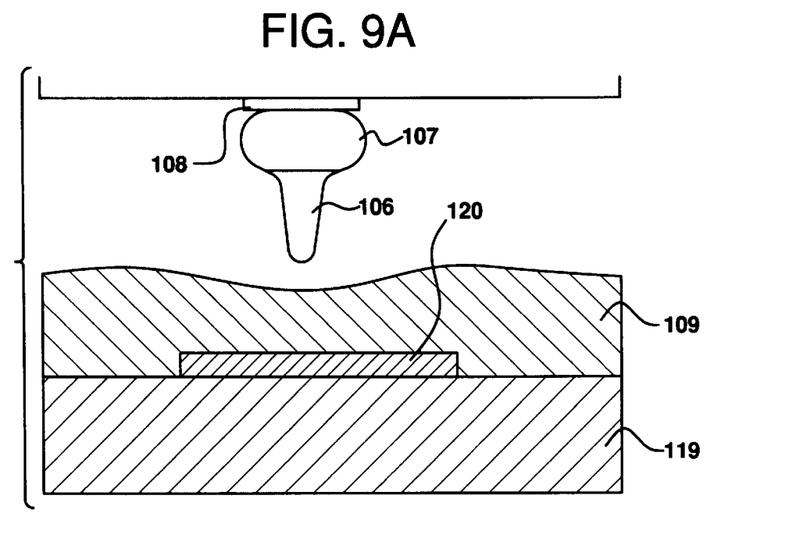
FIGS. 9A–9C are views illustrating a mounted structure of a third embodiment and manufacturing steps thereof according to the present invention.
Figure 9B:
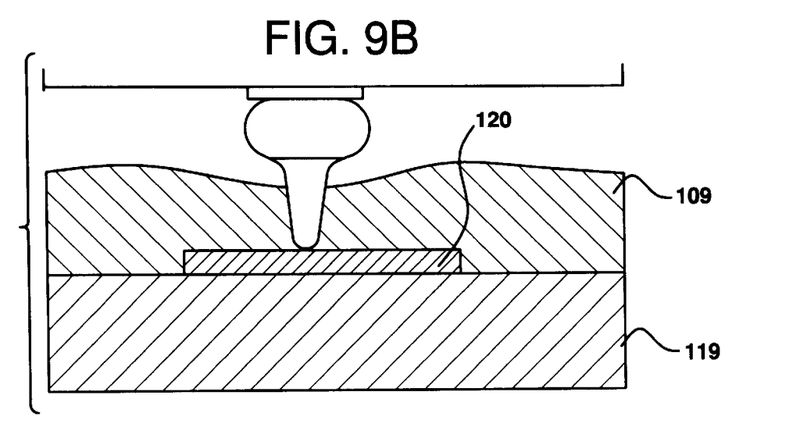
Figure 9C:
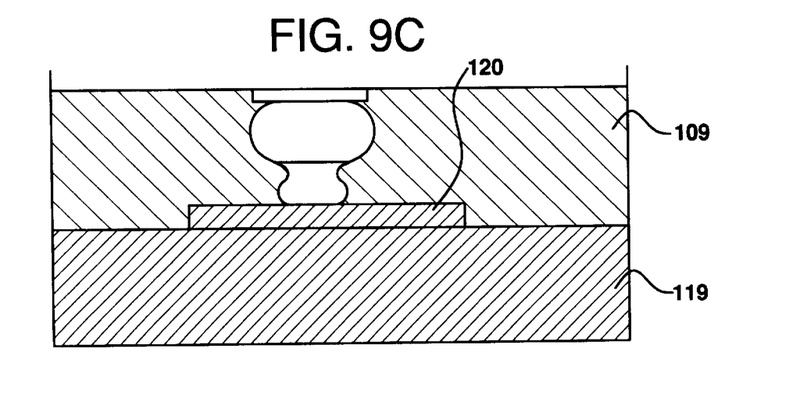

In a third embodiment according to the present invention shown in FIG. 9A–9C, a substrate 119 has no inner layer circuit, and a mounting pad 120 is formed on the upper surface thereof. Further, the mounting pad 120 is not formed as a concave shape. On the other hand, both the method of forming and the shape of the bump electrode 107 formed to the semiconductor device 105 are the same as those of the bump electrode in the first and the second embodiments according to the present invention already explained. Steps mounting the semiconductor device 105 to a substrate 110 shown in FIGS. 9A–9C are basically equal with the method shown in FIGS. 2A–2C. In this embodiment, since the substrate 119 has no inner circuit, when the pressing force to the substrate 119 by the semiconductor device 105 is too large, it results in deformation of the mounting pad 120, so that a care should be taken. On the other hand, since the area of contact between the bump electrode 107 and the mounting pad 120 is enlarged from the point to the plane by utilizing the plastic deformation of the bump electrode 107, sealing resin can be prevented from remaining between the bump electrode 107 and the mounting pad 120, so that the connection state can be made more satisfactory compared with conventional mounted structure.

It is apparent that the present invention is not limited to the above embodiment but may be modified and changed without departing from the scope and spirit of the present invention.

What is claimed is:

1. A structure for mounting a semiconductor device to a substrate, comprising:

a mounting pad disposed on said substrate, a sealing resin provided on said substrate on which said semiconductor device is to be mounted, and a plurality of protecting electrodes disposed on a surface of said semiconductor device facing said substrate, and each said protecting electrode including a substantially spherical portion and a pointed portion in contact under pressure with said mounting pad and deformed such that a contact portion with said mounting pad is enlarged from a point to a plane;

wherein said mounting pad has a concave portion and said concave portion has an opening portion smaller than the bottom.

2. The structure as claimed in claim 1, wherein a diameter for the pointed portion of each of said projecting electrodes after deformation is greater than a diameter for the opening portion of the concave portion of said mounting pad.

3. A structure for mounting a semiconductor device to a substrate, comprising:

a mounting pad disposed on said substrate, a sealing resin provided on said substrate on which said semiconductor device is to be mounted, and a plurality of projecting electrodes disposed on a surface of said semiconductor device facing said substrate, and each said projecting electrode including a substantially spherical portion and a pointed portion in contact under pressure with said mounting pad and deformed such that a contact portion with said mounting pad is enlarged from a point to a plane;

wherein a length of the pointed portion of each of said projecting electrodes before deformation is from 40% to 70% relative to an entire length of said projecting electrode.

4. A structure for mounting a semiconductor device to a substrate, comprising:

a mounting pad disposed on said substrate, a sealing resin provided on said substrate on which said semiconductor device is to be mounted, and a plurality of projecting electrodes disposed on a surface of said semiconductor device facing said substrate, and each said projecting electrode including a substantially spherical portion and a pointed portion in contact under pressure with said mounting Pad and deformed such that a contact portion with said mounting pad is enlarged from a point to a plane;

wherein a length of the pointed portion of each of said projecting electrodes before deformation is from 50% to 60% relative to an entire length of said projecting electrode.

5. A structure for mounting a semiconductor device to a substrate, comprising:

a mounting pad disposed on said substrate, a sealing resin provided on said substrate on which said semiconductor device is to be mounted, and a plurality of projecting electrodes disposed on a surface of said semiconductor device facing said substrate, and each said projecting electrode including a substantially spherical portion and a pointed portion in contact under pressure with said mounting pad and deformed such that a contact portion with said mounting pad is enlarged from a point to a plane;

wherein a length of the pointed portion of each of said projecting electrodes after deformation is not more than 50% of a length of said pointed portion before deformation.

* * * * *